(12) United States Patent
Lai et al.

(10) Patent No.: US 9,952,277 B2
(45) Date of Patent: Apr. 24, 2018

(54) TEST DEVICE AND METHOD USING SINGLE PROBE TO TEST MULTIPLE PADS OF CHIP

(71) Applicant: SYNC-TECH SYSTEM CORP., Hsinchu County (TW)

(72) Inventors: Hung-Wei Lai, Hsinchu County (TW); Tsung-Jun Lee, Hsinchu County (TW)

(73) Assignee: SYNC-TECH SYSTEM CORP., Hsinchu County (TW)

( * ) Notice: Subject to any disclaimer, the term of this patent is extended or adjusted under 35 U.S.C. 154(b) by 87 days.

(21) Appl. No.: 15/097,291

(22) Filed: Apr. 13, 2016

(65) Prior Publication Data

US 2017/0074922 A1    Mar. 16, 2017

Related U.S. Application Data

(60) Provisional application No. 62/217,009, filed on Sep. 10, 2015.

(51) Int. Cl.
*G01R 31/28* (2006.01)
*G01R 31/3185* (2006.01)

(52) U.S. Cl.
CPC .. *G01R 31/2853* (2013.01); *G01R 31/318511* (2013.01); *G01R 31/2844* (2013.01)

(58) Field of Classification Search
None
See application file for complete search history.

(56) References Cited

U.S. PATENT DOCUMENTS

| | | | | |
|---|---|---|---|---|
| 6,278,176 B1* | 8/2001 | Nakamura | ........ | H01L 23/49572 257/668 |
| 6,426,467 B1* | 7/2002 | Gyouten | ................. | H01L 22/32 174/260 |
| 7,608,932 B2* | 10/2009 | Marinet | ................ | H01L 23/544 257/620 |
| 9,632,109 B2* | 4/2017 | Dibattista | ............ | G01R 1/0491 |
| 2006/0190779 A1 | 8/2006 | Nakatsu | | |
| 2007/0285113 A1* | 12/2007 | Whetsel | ............. | G01R 31/2884 324/756.05 |

FOREIGN PATENT DOCUMENTS

| | | |
|---|---|---|
| CN | 101447480 A | 6/2009 |
| TW | 529110 | 4/2003 |
| TW | 200402844 | 2/2004 |
| TW | 200805539 | 1/2008 |
| WO | 2007130764 A1 | 11/2007 |

* cited by examiner

*Primary Examiner* — Paresh Patel
(74) *Attorney, Agent, or Firm* — Winston Hsu

(57) ABSTRACT

A test device uses a single probe to test plurality of pads of at least one chip, and includes a test circuit, a plurality of short-circuit elements and a plurality of probes. The plurality of short-circuit elements is formed in scribe lines around the at least one chip, where each of the plurality of short-circuit elements connects the plurality of pads, and the plurality of pads includes one testing pad and at least one non-testing pad. The plurality of probes receives a plurality of test signals generated by the at least one chip from the testing pad via the plurality of short-circuit elements, so the test circuit generates a test result according to the plurality of test signals.

10 Claims, 5 Drawing Sheets

TEST DEVICE AND METHOD USING SINGLE PROBE TO TEST MULTIPLE PADS OF CHIP

CROSS REFERENCE TO RELATED APPLICATIONS

This application claims the benefit of U.S. Provisional Application No. 62/217,009, filed on Sep. 10, 2015 and entitled "Pads Short in Scribe line", the contents of which are incorporated herein.

BACKGROUND OF THE INVENTION

1. Field of the Invention

The present invention relates to a test device and test method, and more particularly, to a test device and test method by connecting multiple pads in scribe lines to test multiple pads of a chip using single probe.

2. Description of the Prior Art

Nowadays the semiconductor process is mature and well developed to create integrated circuits (ICs) that widely used in electrical and electronic devices, where the ICs play the core computing element for versatile application and functional control. As the semiconductor process advances intricately, adaptive testing equipment and relative testing methods are developed for testing the functionality and quality of the ICs. For example, a pad test for the ICs aims at testing connectivity of wire-bonding or gold bump, which avoids the ICs with bad connectivity from packaging to achieve defective elimination and quality control in the market.

FIG. 1 is a schematic diagram of a wafer 1. The wafer 1 includes a plurality of chips (or die) 10, where scribe lines 12 are formed around the chips 10. The pad test is performed to the wafer 1 once it is made. Afterwards, packaging and dicing processes are performed to the wafer 1 to encapsulate the chip 10, and then chips 10 are separated by dicing along the scribe lines 12 to remove the scribe lines 12. Finally, the chips 10 are ready for shipment.

However, as the semiconductor process advances and becomes more intricate, the number of pads of the chip increases. In order to increase the number of the chips manufactured in the wafer under the same area for yield rate improvement, the pad size becomes smaller and the pads of the chip are distributed denser under the same area. Further, the number of probes of the conventional test device (e.g., probe card) must be equal to the number of all pads of one chip, so the number of probes is correspondingly increased and the probes are distributed denser at the same time, which makes the circuit design of the test device more complicated and leads to higher productive effort for the test device. Usually, the higher density of the probes (e.g., the pitch between two probes is too close) leads to higher cost, worse reliability, and short lifetime of the test device.

Therefore, how to design a test device for the pad test to solve the issues above mentioned and improve the reliability has become a challenge in the industry.

SUMMARY OF THE INVENTION

It is therefore an objective of the present invention to provide a test device and test method by connecting multiple pads in scribe lines to test multiple pads of a chip by single probe.

The present invention discloses a test device, for testing at least one chip of a wafer, wherein scribe lines are formed around the at least one chip. The test device includes a test circuit, a plurality of short-circuit elements, and a plurality of probes. The test circuit is coupled to the at least one chip, for generating a first control signal to the at least one chip, so the at least one chip generates a plurality of test signals. The plurality of short-circuit elements is formed in the scribe lines, where each of the plurality of short-circuit elements is used for connecting the plurality of pads of the at least one chip, and the plurality of pads includes a testing pad and at least one non-testing pads. The plurality of probes is coupled to the plurality of short-circuit elements and the test circuit, for receiving the plurality of test signals from the testing pad via the plurality of short-circuit elements, so the test circuit generates a test result according to the plurality of test signals.

The present invention further discloses a test method for testing a chip of a wafer, wherein scribe lines are formed around the at least one chip. The test method includes generating a first control signal to the at least one chip, so the at least one chip generates a plurality of test signals; forming a plurality of short-circuit elements in the scribe lines, where each of the plurality of short-circuit elements is used for connecting the plurality of pads of the at least one chip, and the plurality of pads includes a testing pads and at least one non-testing pads; receiving the plurality of test signals from the testing pad via the plurality of short-circuit elements; and generating a test result according to the plurality of test signals.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
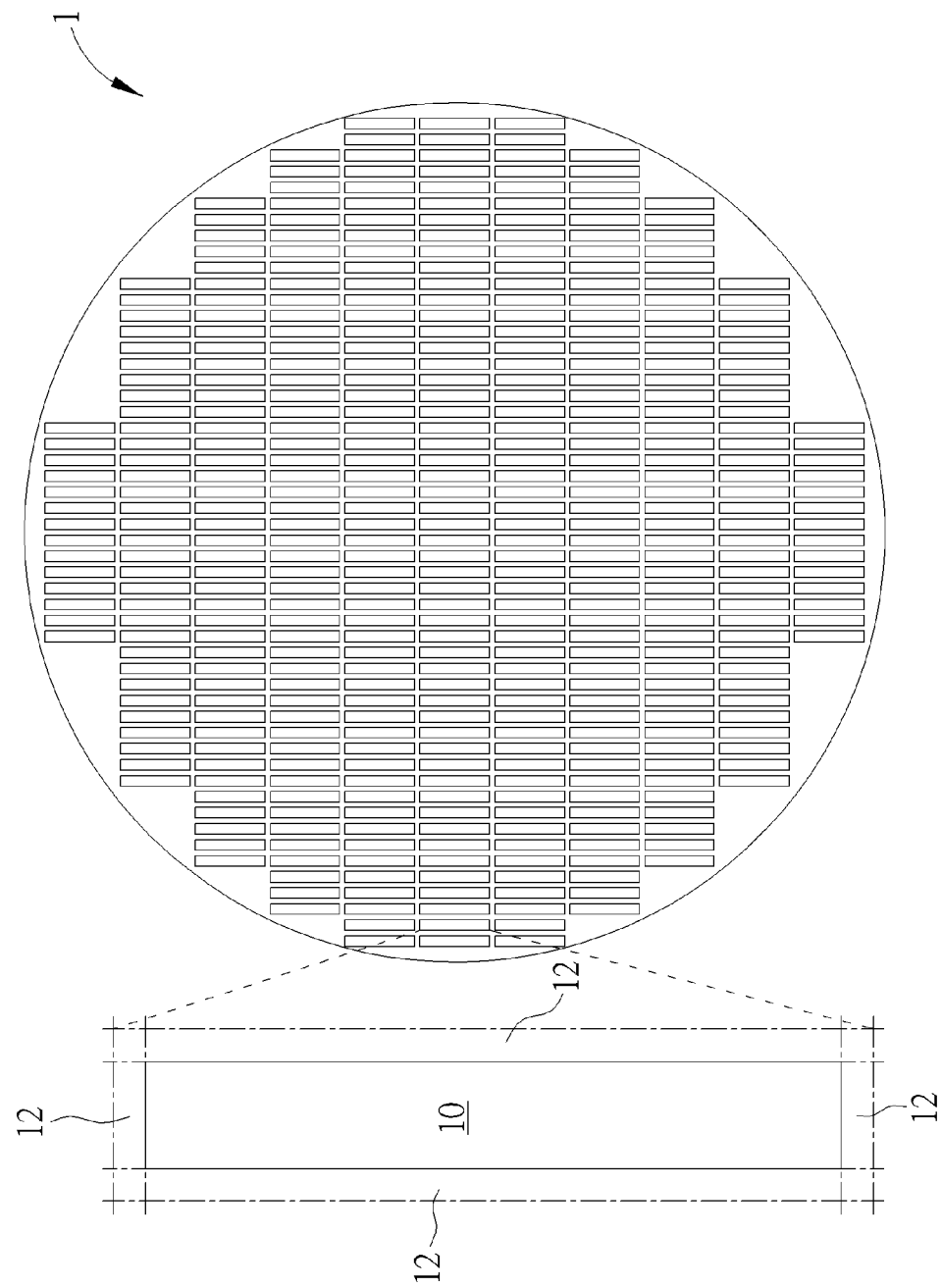
FIG. 1 is a schematic diagram of a wafer.
Figure 2:
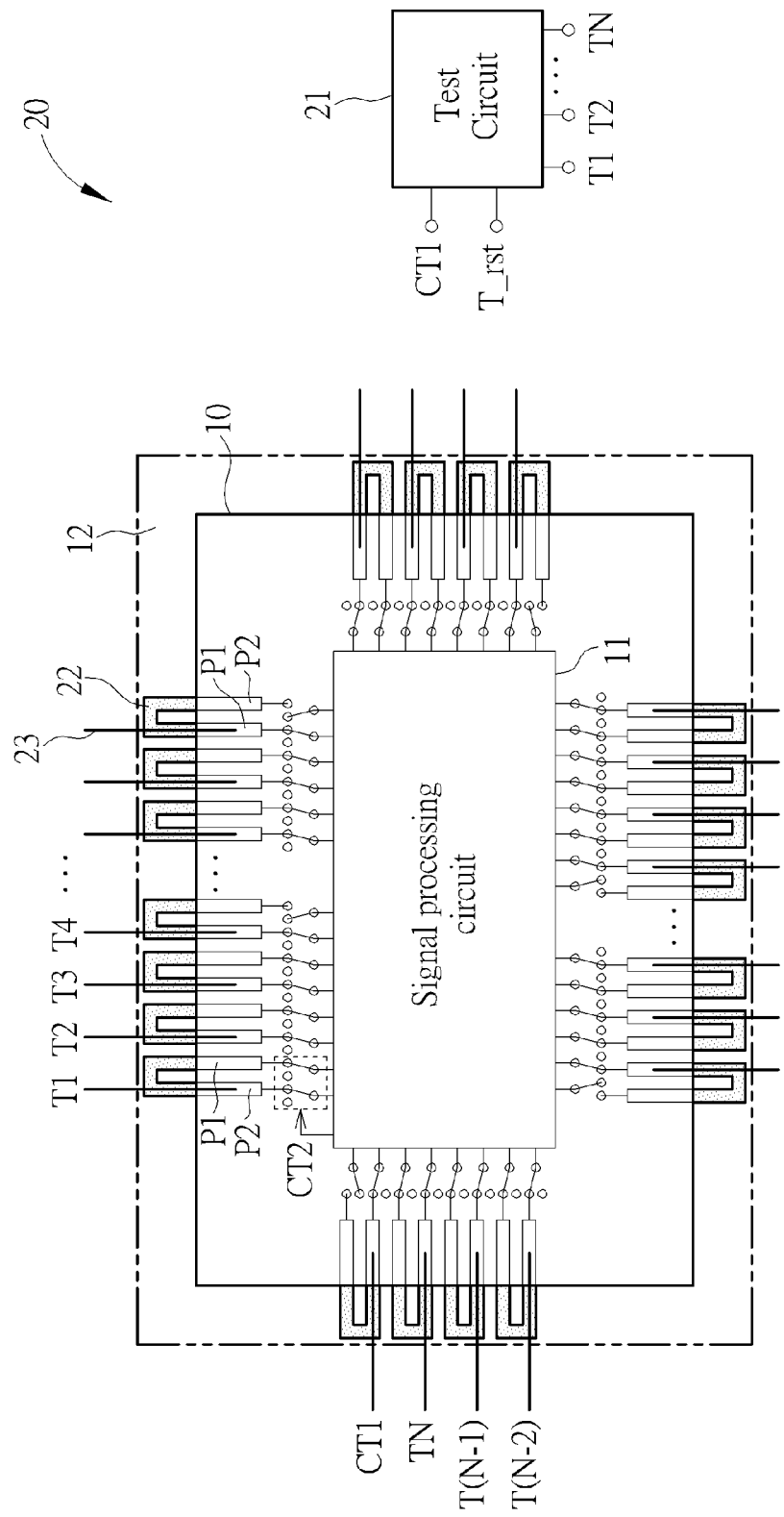
FIG. 2 is a schematic diagram of a test device according to an embodiment of the present invention.

FIG. 2 is a schematic diagram of a test device 20 according to an embodiment of the present invention. The test device 20 can be a probe card for testing the chip 10 of the wafer 1 in FIG. 1. The test device 20 includes a test circuit 21, a plurality of short-circuit elements 22, and a plurality of probes 23.

The test circuit 21 is coupled to the chip 10, for generating a control signal CT1 to the chip 10, and the chip 10 generates test signals T1~TN accordingly. The short-circuit elements 22 are formed in the scribe lines 12 for connecting the plurality of pads of the chip 10 with one and another, where the plurality of pads includes a testing pads and at least one non-testing pads. For simplify description, in this embodiment, the short-circuit elements 22 connect two pads P1 and P2, where the testing pad is given P1 and the non-testing pad is given P2.

The probes 23 is coupled to the short-circuit elements 22 and the test circuit 21, for receiving the test signals T1~TN from the testing pad P1 via the short-circuit elements 22, and the test circuit 20 generates a test result T_rst according to the test signals T1~TN. As a result, operators can determine whether the chip 10 is functional according to test result T_rst, so as to perform the following dicing and packaging process for shipments.

Noticeably, the chip 10 is usually designed with built-in switches (or switching elements, or variable impedance circuit) and a signal processing circuit 11, where the signal processing circuit 11 can perform computations regarding the pad test, and the signal processing circuit 11 can control the plurality of switches to achieve signal input/output for the pad test. Accordingly, the present invention utilizes the chip 10 to assist the test device 20 performing the pad test.

Specifically, the signal processing circuit 11 is coupled to the test circuit 21, for generating a control signal CT2 and the test signals T1~TN according to the control signal CT1. The plurality of switches is respectively coupled to the plurality of pads and the signal processing circuit 11, for connecting the testing pad with the signal processing circuit 11 and disconnecting the non-testing pads from the signal processing circuit 11 according to the control signal CT2, so the test signals T1~TN can be outputted via the testing pad.

Take outputting the test signal T1 for example, when the control signal CT1 indicates that the testing pad is P1 and the non-testing pads is P2, the signal processing circuit 11 generates the control signal CT2 to the plurality of switches corresponding to the pads P1 and P2 to connect the testing pad P1 with the signal processing circuit 11, and disconnect the non-testing pad P2 from the signal processing circuit 11. On the contrary, when the control signal CT1 indicates that the testing pad is P2 and the non-testing pads is P1, the signal processing circuit 11 generates the control signal CT2 to the plurality of switches corresponding to the pads P1 and P2 to connect the testing pad P2 with the signal processing circuit 11, and disconnect the non-testing pad P1 from the signal processing circuit 11. As a result, the test device 20 can utilize the single probe 23 to test two pads, which reduces the number of probes required for testing the chip 10.

Figure 3:
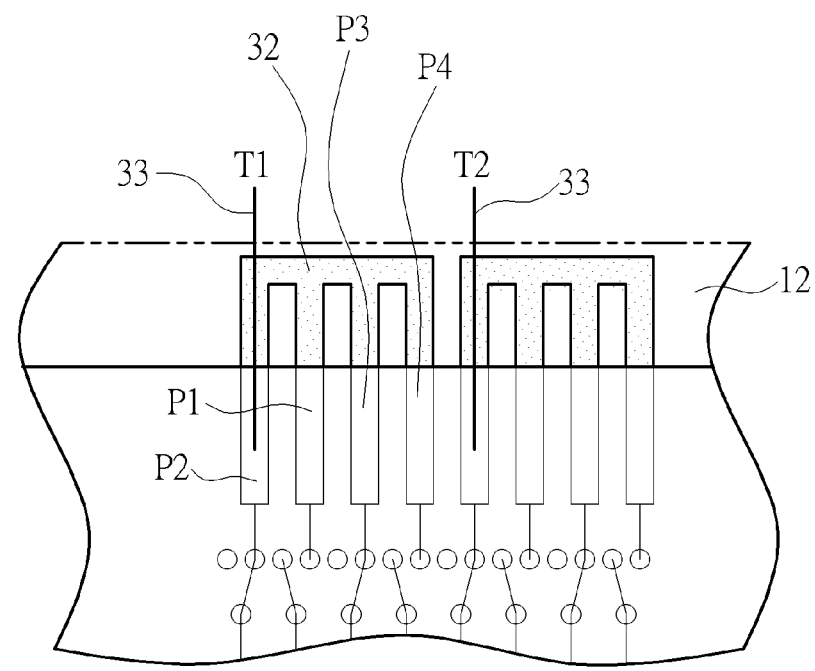
FIG. 3 is a schematic diagram of a portion of test device according to another embodiment of the present invention.

FIG. 3 is a schematic diagram of a portion of test device 30 according to another embodiment of the present invention. The test device 30 includes probes 33 and a plurality of short-circuit elements 32 formed on the scribe lines 12, where each of the short-circuit elements 32 is used for connecting four pads P1, P2, P3 and P4. The test device 30 can output the control signal CT1 to indicate one of the four pads P1, P2, P3 and P4 being the testing pad and rest of three pads being the non-testing pads. For example, if the pad P2 is the testing pad, then the pads P1, P3 and P4 are the non-testing pads. The chip 10 can control the plurality of switches corresponding to the pads P1, P2, P3 and P4 to connect the testing pad P2 with the signal processing circuit 11 (not shown in FIG. 3), and disconnect the non-testing pads P1, P3 and P4 from the signal processing circuit 11. And so forth, the test device 30 can utilize the single probe 33 to test four pads, which reduces the number of probes required for testing the chip 10.

Figure 4:
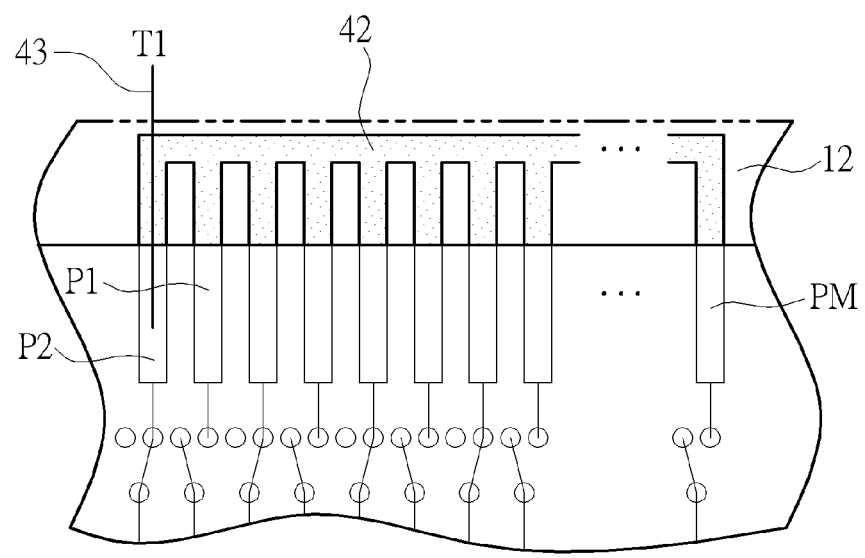
FIG. 4 is a schematic diagram of a portion of test device according to another embodiment of the present invention.

FIG. 4 is a schematic diagram of a portion of test device 40 according to another embodiment of the present invention. The test device 40 includes probes 43 and a plurality of short-circuit elements 42 formed on the scribe lines 12, where each of the short-circuit elements 42 is used for connecting M pads P1~PM. The test device 40 can output the control signal CT1 to indicate one of M pads P1~PM being the testing pad and rest of (M−1) pads being the non-testing pads. For example, if the pad P2 is the testing pad, then the pads P1 and P3~PM are the non-testing pads.

The chip 10 can control the plurality of switches corresponding to the pads P1~PM to connect the testing pad P2 with the signal processing circuit 11 (not shown in FIG. 4), and disconnect the non-testing pads P1 and P3~PM from the signal processing circuit 11. And so forth, the test device 40 can utilize the single probe 43 to test M pads, which reduces the number of probes required for testing the chip 10.

As can be seen from the embodiments of FIG. 2 to FIG. 4, given that the short-circuit elements simultaneously connect M pads, and the chip 10 includes K pads in total. The test circuit of the present invention utilizes 1/M of probes to test all pads of single chip 10, where N=K/M and N is probe number. In other words, the test circuit of the present invention utilizes probes with less number to test all pads of single chip 10. With the less number of the probes, the pitch between two probes can be increased, which simplifies productive effort in making the probe card to improve the yield rate and lifetime of the probe card.

On the other hand, with the less number of the probes, though the testing time is relatively increased, it brings the benefits including reduced cost and productive effort that is more valuable than the cost of testing time. Therefore, the test device of the present invention is quite competitive in the industry. In practice, the testing time increased by the short-circuit element connecting two to eight pads (i.e., M=2~8) is acceptable.

Figure 5:
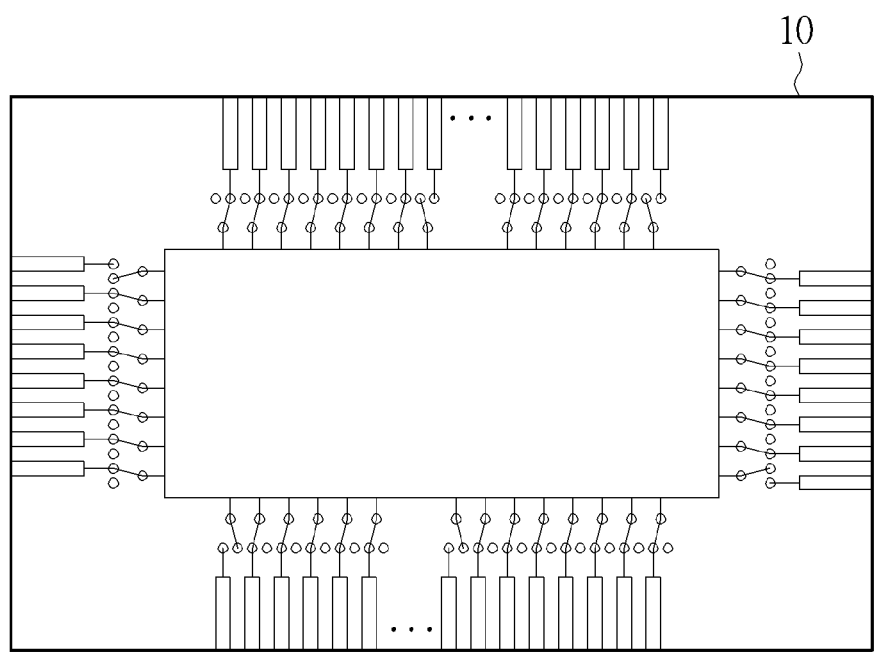
FIG. 5 illustrates a chip after a dicing process is finished.

FIG. 5 illustrates the chip 10 after a dicing process is finished. The test device 20, 30 and 40 respectively includes a dicing unit (not shown in FIGS. 2 to 4) coupled to the test circuit 21 for performing a dicing process to separate the chips 10 and remove the short-circuit elements 22, 32 and 43. The dicing unit is used to perform the dicing process during manufacturing, which can be any kinds of equipment for dicing such as a laser cutter, drill, knife, and so on. Since the short-circuit elements are formed in the scribe lines, the short-circuit elements are cut off along with the scribe lines when the dicing process is performed to the chip 10, and there is no extra process and cost in removing the short-circuit elements. Noticeably, the present invention performs the pad test once the wafer is produced, so before performing the dicing process, the good chips can be selected, and the bad chips can be eliminated according to test results. Therefore, the following packaging process is only performed to the good chips to ensure product quality.

In short, the present invention forms the short-circuit elements in the scribe lines to simultaneously connect a plurality of pads of the chip, and utilizes the built-in switches of the chip to connect the testing pad with the test device and disconnect the non-testing pads from the test device, so the test device can output the test signals via the testing pad to obtain the corresponding test results. Therefore, the test circuit of the present invention can use single probe to test multiple pads, which means that all pads of the single chip are tested with less number of probes. With the less number of probes, the pitch between two probes can be increased, which reduces the productive effort in making the probe card to improve the yield rate and lifetime of the probe card. In addition, since the short-circuit elements are formed in the scribe lines, the short-circuit elements are cut off along with the scribe lines when the dicing process is performed to the chip 10, and there is no extra process and cost in removing the short-circuit elements.

Figure 6:
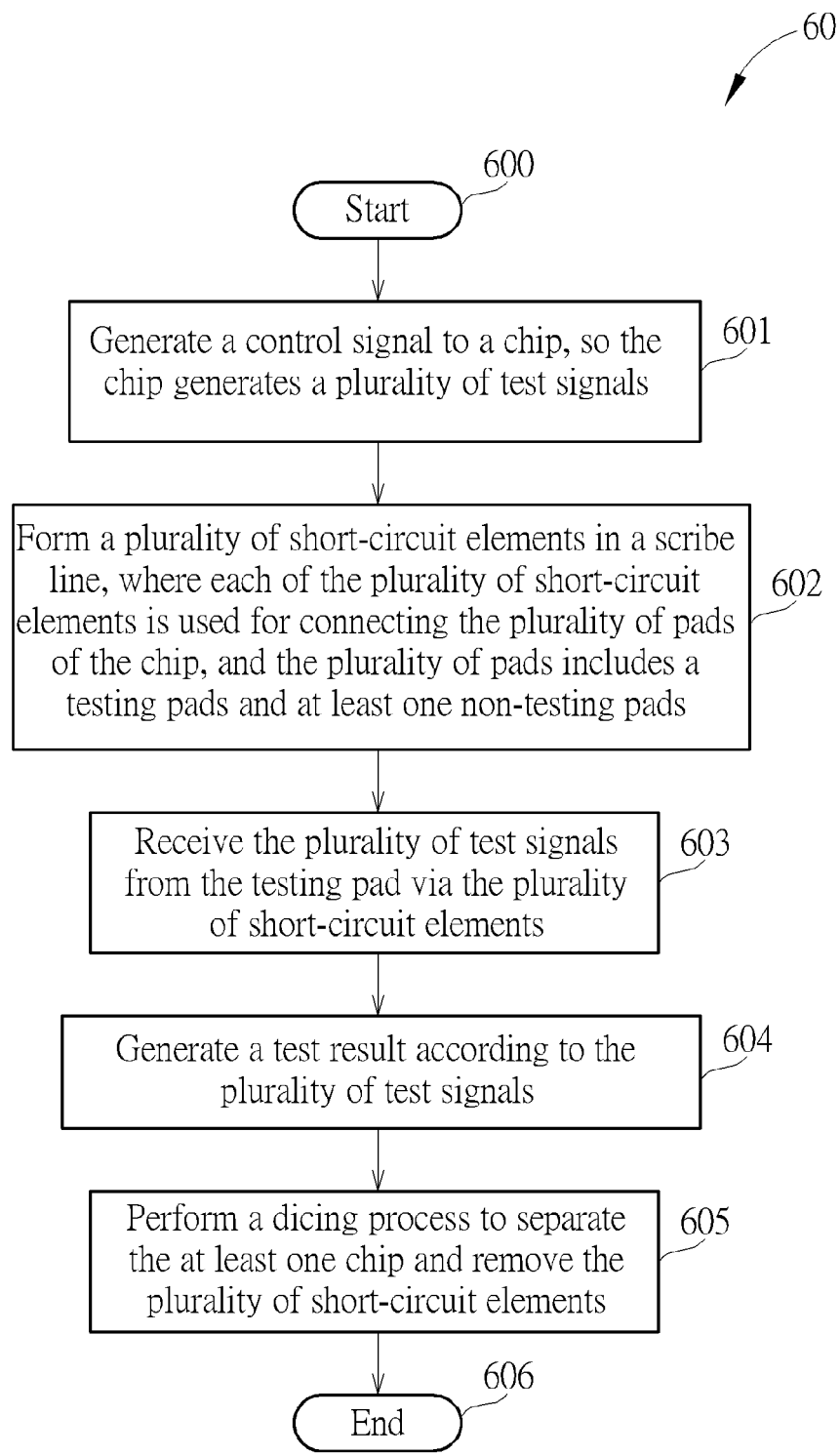
FIG. 6 is a flowchart of a process for testing pads of the chip according to an embodiment of the present invention.

Operations of the embodiments above described can be summarized into a test process 60, in FIG. 6, the test process 60 can be utilized in the test device for performing the pad test to the chip. The test process 60 includes the following steps.

Step 600: Start.
Step 601: Generate a control signal to at least one chip, so the at least one chip generates a plurality of test signals.
Step 602: Form a plurality of short-circuit elements in a scribe line, where each of the plurality of short-circuit elements is used for connecting the plurality of pads of the at least one chip, and the plurality of pads includes a testing pads and at least one non-testing pads.
Step 603: Receive the plurality of test signals from the testing pad via the plurality of short-circuit elements.
Step 604: Generate a test result according to the plurality of test signals.
Step 605: Perform a dicing process to separate the at least one chip and remove the plurality of short-circuit elements.
Step 606: End.

Detailed descriptions of the test process 60 can be obtained by referring to embodiments of FIG. 2 to FIG. 4, which is omitted. The conversion from Step 602 to Step 603 are operations regarding the chip connecting the testing pad with its built-in signal processing circuit and disconnecting the non-testing pads from its built-in signal processing circuit according to control signal, which can be obtained by referring to embodiments of FIG. 2 to FIG. 4.

To sum up, the present invention forms the short-circuit elements in the scribe lines to simultaneously connect a plurality of pads of the chip, and utilizes the built-in switches of the chip to connect the testing pad with the test device and disconnect the non-testing pads from the test device, so the test device can output the test signals by the testing pad to obtain the corresponding test results. Therefore, the test circuit of the present invention can use single probe to test multiple pads, which means that all pads of the single chip are tested with less number of probes. With the less number of probes, the pitch between two probes can be increased, which reduces the productive effort in making the probe card to improve the yield rate and lifetime of the probe card. In addition, since the short-circuit elements are formed in the scribe lines, the short-circuit elements are cut off along with the scribe lines when the dicing process is performed to the chip, and there is no extra process and cost in removing the short-circuit elements.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A test device, for testing at least one chip of a wafer, wherein scribe lines are formed around the at least one chip, and the test device comprises:
  a test circuit, coupled to the at least one chip, for generating a first control signal to a control pad of the at least one chip, wherein the at least one chip generates a test signal corresponding to a testing pad of the at least one chip according to the first control signal;
  a plurality of short-circuit elements, formed in the scribe lines, where each of the plurality of short-circuit elements is used for connecting the plurality of pads of the at least one chip, and the plurality of pads includes a testing pad for outputting the test signal and at least one non-testing pads for not outputting any signal; and
  a plurality of probes, coupled to the plurality of short-circuit elements and the test circuit, for receiving the test signal corresponding to the testing pad via the plurality of short-circuit elements, wherein the test circuit generates a test result according to the test signal corresponding to the testing pad.

2. The test device of claim 1, wherein the at least one chip comprises:
  a signal processing circuit, coupled to the test circuit, for generating a second control signal and the test signal corresponding to the testing pad according to the first control signal; and
  a plurality of switches, coupled to the plurality of pads and the signal processing circuit, for connecting the testing pad with the signal processing circuit and disconnecting the at least one non-testing pads from the signal processing circuit according to the second control signal, to output the test signal corresponding to the testing pad.

3. The test device of claim 1, wherein the plurality of probes includes N probes, the plurality of pads includes M pads, and the at least one chip includes (N*M) pads.

4. The test device of claim 3, wherein the M pads substantially comprises two, three, four, five, six, seven or eight pads.

5. The test device of claim 1, further comprising:
  a dicing unit, coupled to the test circuit, for performing a dicing process along the scribe lines after the at least one chips is tested, to separate the at least one chip and remove the plurality of short-circuit elements.

6. A test method for testing a chip of a wafer, wherein scribe lines are formed around the at least one chip, and the test method comprises:
  generating a first control signal to a control pad of the at least one chip, wherein the at least one chip generates a test signal corresponding to a testing pad of the at least one chip according to the first control signal;
  forming a plurality of short-circuit elements in the scribe lines, where each of the plurality of short-circuit elements is used for connecting the plurality of pads of the at least one chip, and the plurality of pads includes a testing pads and at least one non-testing pads;
  receiving the test signal corresponding to the testing pad via the plurality of short-circuit elements; and
  generating a test result according to the test signal corresponding to the testing pad.

7. The method of claim 6, wherein the at least one chip generates a second control signal and the test signal corresponding to the testing pad according to the first control signal; and the at least one chip connects the testing pad with the signal processing circuit and disconnects the at least one non-testing pads from the signal processing circuit according to the second control signal, to output the test signal corresponding to the testing pad.

8. The method of claim 6, wherein the plurality of probes includes N probes, the plurality of pads includes M pads, and the at least one chip includes (N*M) pads.

9. The method of claim 8, wherein the M pads substantially comprises two, three, four, five, six, seven or eight pads.

10. The method of claim 6, further comprising:
  performing a dicing process along the scribe lines after the at least one chips is tested, to separate the at least one chip and remove the plurality of short-circuit elements.

* * * * *